United States Patent
Starkston et al.

(10) Patent No.: US 7,015,592 B2
(45) Date of Patent: Mar. 21, 2006

(54) MARKING ON UNDERFILL

(75) Inventors: Robert Starkston, Phoenix, AZ (US); Jason Zhang, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 190 days.

(21) Appl. No.: 10/804,801

(22) Filed: Mar. 19, 2004

(65) Prior Publication Data
US 2005/0206017 A1    Sep. 22, 2005

(51) Int. Cl.
*H01L 23/29*  (2006.01)
*H01L 21/44*  (2006.01)
*H01L 21/48*  (2006.01)
*H01L 21/50*  (2006.01)

(52) U.S. Cl. .................. 257/787; 257/797; 438/127
(58) Field of Classification Search .............. None
See application file for complete search history.

(56) References Cited

U.S. PATENT DOCUMENTS

| | | | |
|---|---|---|---|
| 4,695,647 A * | 9/1987 | Eller et al. ............. 560/53 |
| 5,918,363 A * | 7/1999 | George et al. .......... 29/832 |
| 6,201,301 B1 * | 3/2001 | Hoang ................... 257/712 |
| 6,245,595 B1 * | 6/2001 | Nguyen et al. ......... 438/108 |
| 6,365,441 B1 | 4/2002 | Raiser et al. |
| 6,614,122 B1 | 9/2003 | Dory et al. |
| 6,680,220 B1 * | 1/2004 | Minamio et al. ....... 438/110 |
| 2003/0080437 A1 | 5/2003 | Gonzalez et al. |
| 2003/0116864 A1 | 6/2003 | Shi et al. |

OTHER PUBLICATIONS

"Flip-Chip Assembly," printed Jan. 28, 2004, http://www.semiconfareast.com/flipchipassy.htm, 3 pgs.

\* cited by examiner

*Primary Examiner*—David A. Zarneke
(74) *Attorney, Agent, or Firm*—Schwabe, Williamson & Wyatt, P.C.

(57) ABSTRACT

A marking is formed on an underfill between a die and a substrate.

26 Claims, 5 Drawing Sheets

500

MARKING ON UNDERFILL

BACKGROUND OF THE INVENTION

1. Field of the Invention

The present invention relates to, but is not limited to, electronic devices, and in particular, to the field of integrated circuit packaging.

2. Description of Related Art

Integrated circuits are often assembled into packages that may be mounted onto a printed circuit board. Such packages may include a substrate that has solder balls or other types of contacts that are used to couple the substrate to the circuit board. An integrated circuit, such as a die or chip (herein "die"), may be mounted onto the substrate, the die or chip being electrically coupled to the substrate by way of solder bumps or other contact types. Other components such as capacitors and resistors may also be mounted on top of the substrate. Further, the substrate will typically have routing traces, vias and the like, that electrically connects the die to the solder balls or equivalent contacts.

In some cases, a protective or a structural-supporting layer called an underfill may be placed between the die and the substrate. For example, one type of die that is currently being incorporated into integrated circuit packaging is the flip-chip. Flip-chips are chips that are inverted and connected directly to the packaging substrate (or circuit board) rather than using the more common wire bonding techniques. Typically when a flip-chip is mounted onto the packaging substrate, an underfill is inserted between the die and the substrate. The underfill is usually an epoxy material that may structurally reinforce the solder bumps that are located underneath the die and may improve the life and reliability of the package.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention.

One current trend in integrated circuit technology is to reduce the size of integrated circuit packaging. This may be particularly true in the fields of portable personal computers and handheld electronics. Such devices may have very limited space for components and there is a trend to make these devices smaller with more functionality. As a result, there is increasing pressure to decrease the size of the components that go into these devices while increasing the number of these components, including integrated circuit packages (herein "packages").

In order to decrease the size of packages, package components (e.g., dies, capacitors, resistors and the like) may be closely packed together leaving little space for placing a marking. A marking may include any type of symbols, text and/or bar codes that may provide information relating to, for example, component identification, component specification, or any other type of information that may be useful. Among conventional approaches for placing markings is to place the markings on the die backside or designate an area on the surface of the substrate for markings.

Figure 1:
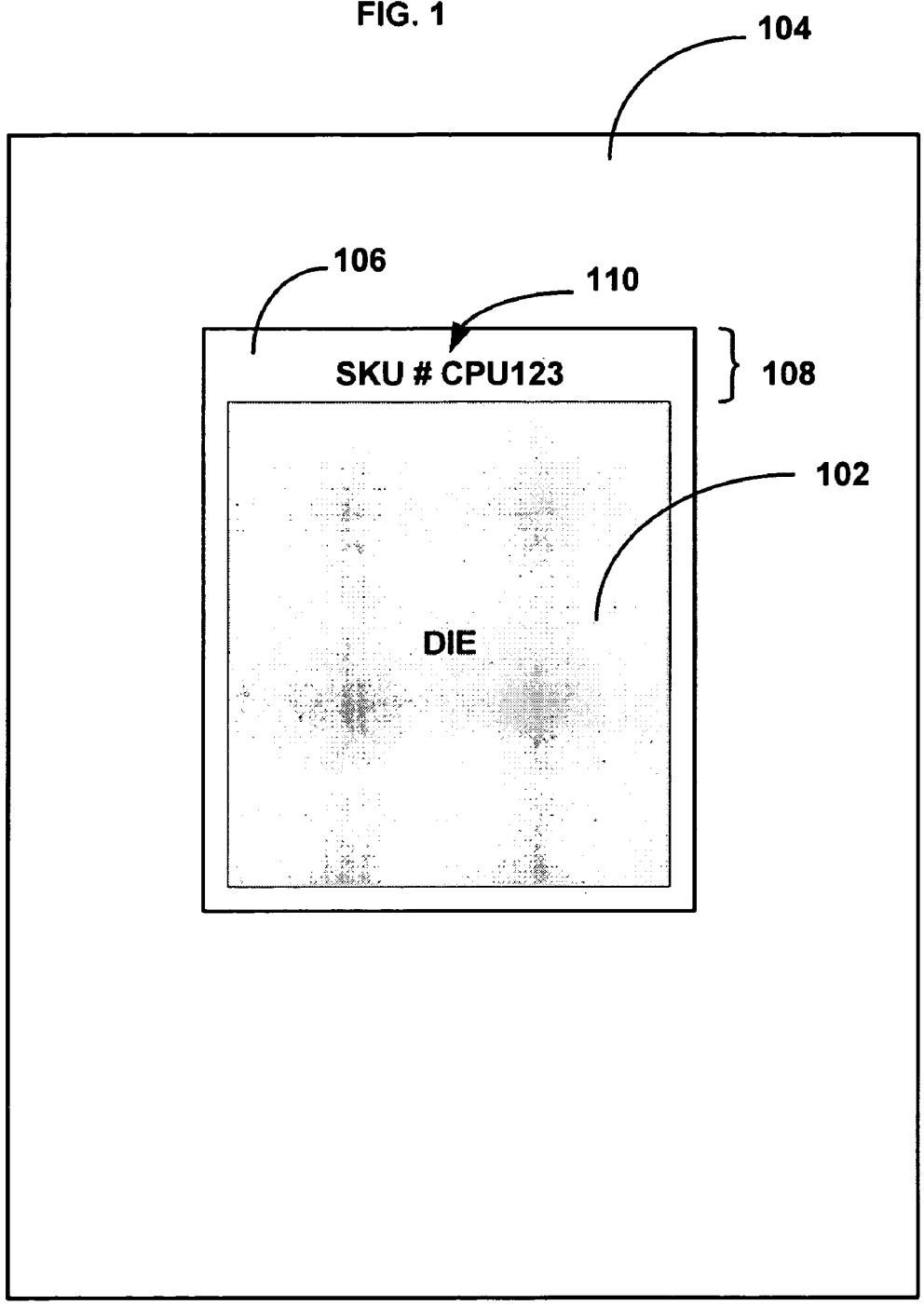
FIG. 1 illustrates a die mounted on a substrate with a marking on an exposed portion of an underfill according to one embodiment of the invention.

According to some embodiments of the invention, markings may be placed on an exposed portion of an underfill. Referring to FIG. 1, which depicts a package with markings placed on an underfill according to one embodiment. For the embodiment, a die 102, such as a flip-chip, is mounted on a substrate 104. Between the die 102 and the substrate 104 is an underfill 106. The underfill 106 may have an exposed portion 108 where a marking 110 may be placed. Although not shown, the substrate 104 may comprise of other components such as capacitors, resistors, and the like.

According to some embodiments, the expose portion 108 may be the underfill tongue, which is the underfill site where a dispenser may have been placed to deposit an underfill material for forming the underfill 106. That is, in some embodiments, in order to form the underfill 106, a dispenser, such as a capillary, may be placed near the die 102. The dispenser may then deposit the underfill material (which may initially be in liquid or semi-liquid form) on to the surface of the substrate 104. After the underfill material has been deposited on the surface of the substrate 104, the dispenser may be retracted leaving behind a relatively large exposed underfill area (i.e., underfill tongue) that is outside the die 102 (i.e., not covered by the die). For these embodiments, this underfill tongue area may not be available for other components because of the presence of the underfill material on the surface of the substrate, which may prevent good electrical contact between the components and conduction pads (e.g., solder lands or surface pads) on the substrate surface. Thus, this underfill tongue area may remain unused.

According to some embodiments, a marking 110 may be placed on this unused underfill tongue area or other exposed underfill portions having sufficient exposed area for a marking. The marking 110 may be but are not limited to laser markings, ink markings, decal markings, and the like. The marking 110 may be in the form of text, numerals, symbols, and/or any other writing forms. The information provided by a marking may be related to component identification, component specification and/or any other type of information.

As previously described, the underfill material that is used to form the underfill 106 may be initially in liquid or semi-liquid form. The underfill 106 may have adhesive properties to bond the die 102 to the substrate 104 and/or structural integrity to protect die and substrate connections (e.g., solder bumps and connections). Additional material may be added to the underfill 106 to produce desirable properties such as pigmentation that may give greater contrast to subsequent markings. According to some embodiments, the underfill 106 is an organic polymer that may contain inorganic fillers used to modify the mechanical properties of the cured material.

The substrate 104, which may comprise of vias and traces, may be an integrated circuit packaging substrate such as but are not limited to Ball Grid Array (BGA), Organic Land Grid Array (OLGA), Flip-chip Pin Grid Array (FC-PGA), and the like. Although not shown, the substrate 104 may further be mounted onto a circuit board or the substrate 104 may itself be the circuit board.

Figure 2:
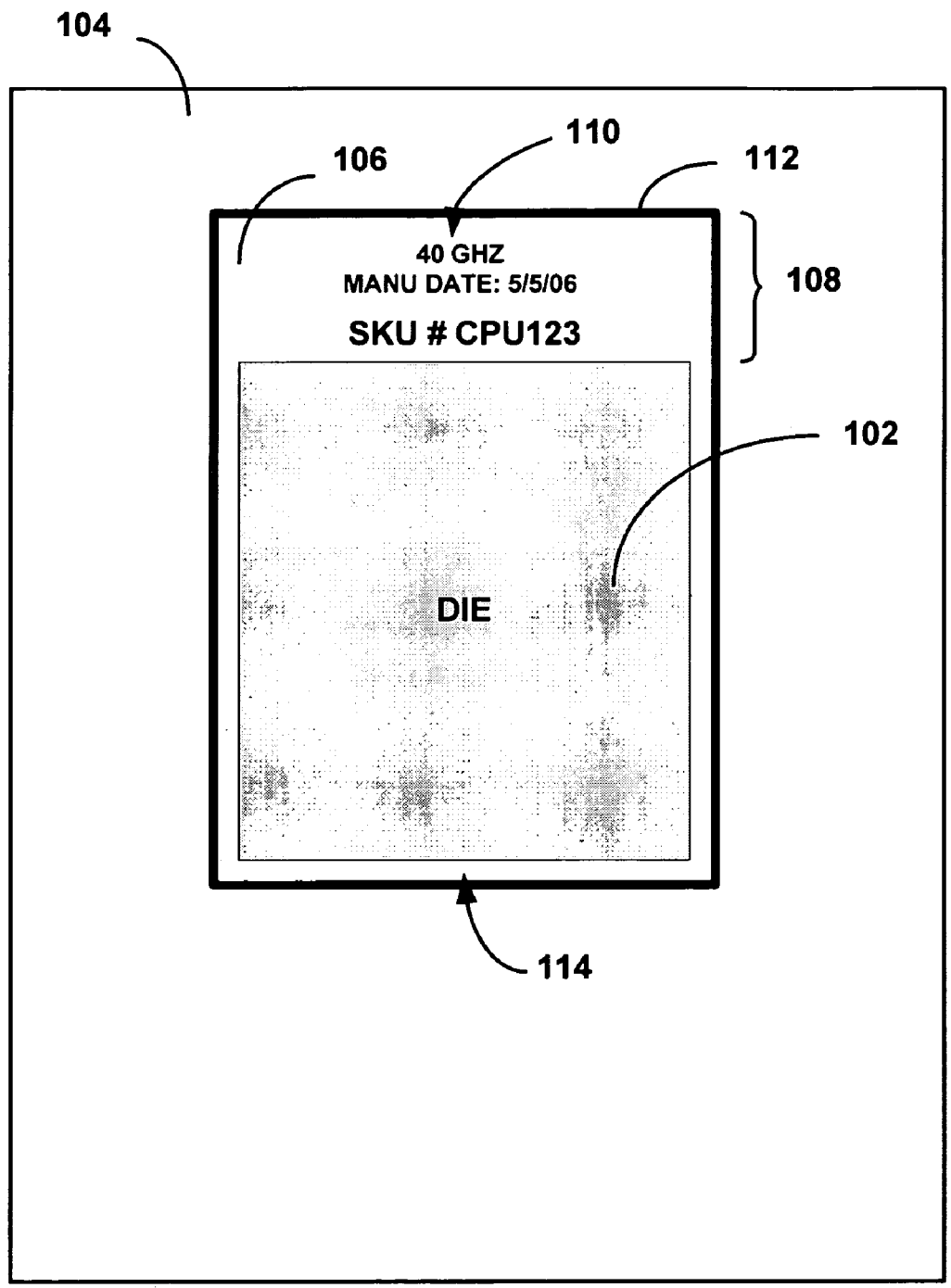
FIG. 2 illustrates a die mounted on a substrate with a marking on an expanded exposed portion of an underfill boarded by an underfill barrier according to another embodiment.

Referring now to FIG. 2, which depicts an underfill 106, having an enlarged exposed portion 108 according to another embodiment. For the embodiment, an underfill barrier 112 is on the surface of the substrate 104 bordering the underfill 106. The underfill barrier 112 may be used during the formation of the underfill 106 to restrict the underfill material to a specific area on the surface of the substrate 104. The underfill barrier 112 is extended away from the die 102 to enlarge the exposed portion 108 thus providing a greater area for placing a larger marking 110. The enlarged exposed portion 108 may be the underfill tongue area or other exposed portions of the underfill 106. According to some embodiments, the exposed underfill area 114 at the bottom of the die 102 may be enlarged to provide a marking location that is separate from the underfill tongue location. Thus, enlargement of the underfill 106 is not restricted to the underfill tongue location (e.g., the location where the dispense capillary was originally placed). Note that although for the embodiment, the underfill barrier 112 completely encircles the underfill 106, in other embodiments, the underfill barrier 112 may not completely encircle the underfill 106. That is, the underfill barrier 112 may be used to only restrict the underfill 106 from spreading to certain areas of the substrate surface.

Figure 3:
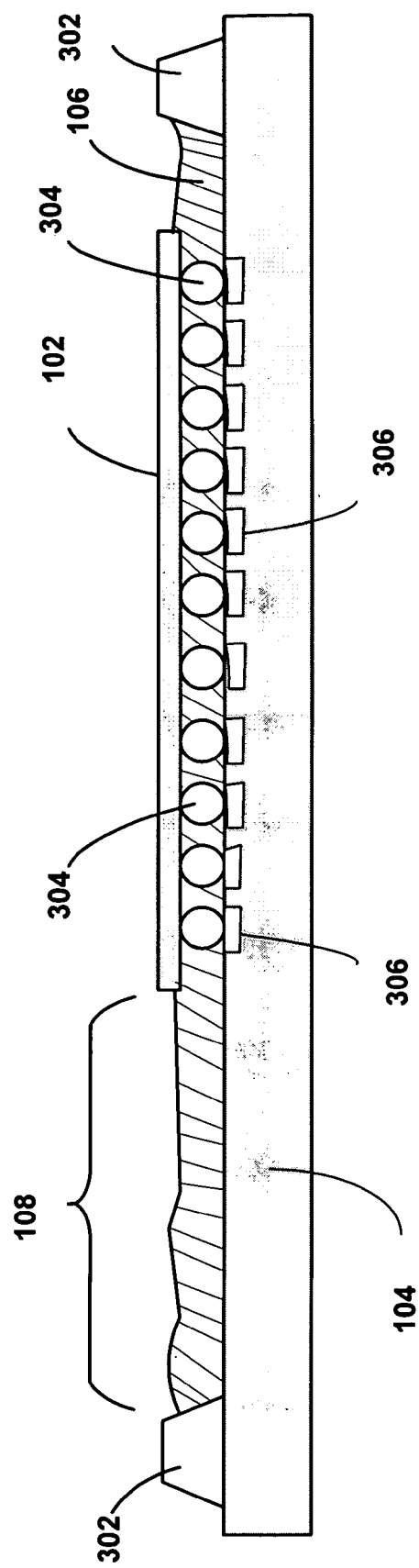
FIG. 3 illustrates a particular embodiment of FIG. 2 of a die mounted on a substrate with marking on an expanded exposed portion of an underfill bordered by an underfill barrier, in particular, a dam underfill barrier according to an embodiment.

Various implements may be used as underfill barrier 112. According to some embodiments, implements such as but not limited to, a dam, a trench and/or an ink border, may be used as the underfill barrier 112. These barriers may also be used in combination to provide greater control over underfill material spread. FIG. 3 depicts a cross sectional view of an underfill dam 302 used to control the spread of underfill material. For the embodiment, the underfill dam 302 facilitates the formation of a large exposed portion 108. The die 102 is on solder bumps 304, which may sit on conduction pads (e.g., solder lands or surface pads) 306 of the substrate 104.

Figure 4:
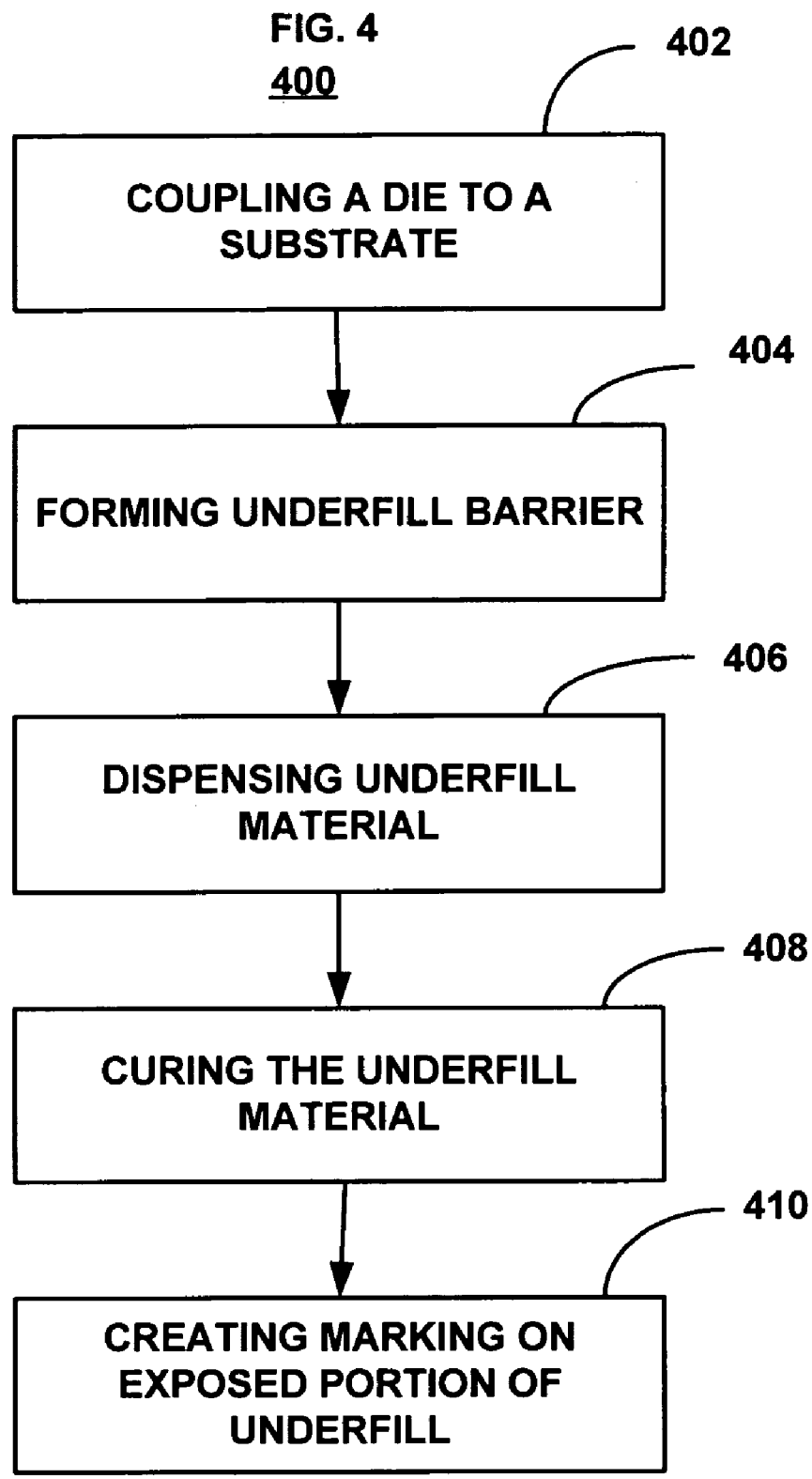
FIG. 4 illustrates a flow chart for forming an integrated circuit package with a marking on an underfill according to some embodiments.

FIG. 4 is a process 400 for creating a marking on an exposed portion of an underfill according to some embodiments. The process 400 may begin when a die 102, such as a flip-chip, is mounted onto a substrate 104 at 402. According to some embodiments, the die 102 may be placed onto solder bumps 304 on top of the substrate 104. For these embodiments, the solder bumps 304 may be formed by electroplating or by deposition and subsequent reflow of the solder paste.

After mounting the die 102 to the substrate 104, an underfill barrier 112 may be formed to control the spread of underfill material at 404. As previously described, the underfill barrier 112 may be a dam, a trench, an ink boarder or a combination thereof. In other embodiments, the underfill barrier 112 may be formed in the substrate prior to chip attachment. In yet other embodiments, the process for forming an underfill barrier 112 may be disregarded.

Following the process for forming the underfill barrier 112, underfill material may be dispensed on to the surface of the substrate at 406. According to one embodiment, this may be accomplished by placing a dispenser, such as a capillary, near the die 102 and within the underfill barrier 112 and injecting the liquid or semi-liquid underfill material onto the surface of the substrate 104. The underfill material may then spread within the substrate surface area that may be completely or partially bordered by the underfill barrier 112 and may or may not completely fill the void spaces between the die 102 and the substrate 104. In order to ensure that the exposed portion 108 of the underfill 106 will have sufficient underfill material (i.e., sufficient underfill material will cover the substrate surface where the marking will be placed), dispense parameters such as underfill material weight and composition, dispenser distance from the chip edge, barrier location and dispenser nozzle size, may be adjusted.

After dispensing the underfill material onto the surface of the substrate, the underfill material may be cured at 408. Such processes are known in the art and may include the use of a curing furnace or oven. Once the curing process is completed, the underfill 106, which may comprise of an epoxy material, may take on certain pigmentation. In some embodiments, the underfill may include coloring that will provide a good contrast to markings that may be subsequently placed onto the underfill 106. In one embodiment, the cured underfill 106 is opaque. The pigmentation of the underfill 106 may depend upon the composition of the underfill material. Thus, desirable pigmentation for the underfill 106 may be obtained by controlling the composition of the underfill material such as by including additives.

After curing the underfill, a marking 110 may be placed onto the exposed portion 108 of the underfill 106. As previously described, the placing of the marking 110 may be accomplished using different techniques such as laser marking, ink marking, decal marking and the like.

Figure 5:
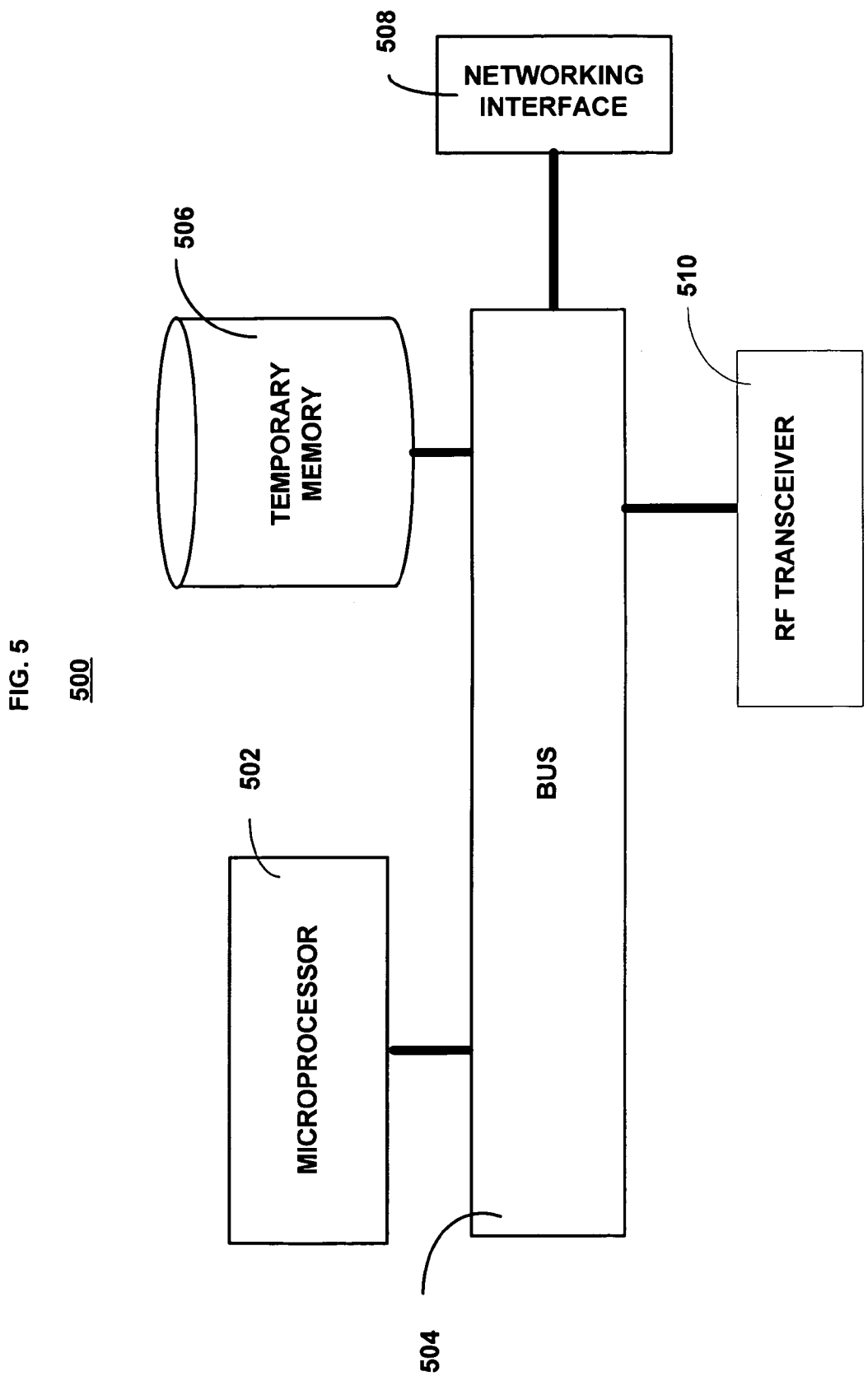
FIG. 5 is a block diagram of an example system, according to some embodiments of the invention.

Referring to FIG. 5 showing a system 500 in accordance with some embodiments. The system 500 includes a microprocessor 502 that may be coupled to a bus 504. The system 500 may further include a temporary memory 506, a network interface 508, and a RF transceiver 510. In an alternative embodiment, the RF transceiver 510 may be part of the network interface 508. One or more of the above enumerated elements, such as microprocessor 502, memory 506, and so forth, may contain one or more of the integrated circuit packages that advantageously incorporate the underfill markings described above. In alternate embodiments, other components, such as a chipset may also include the underfill markings described above.

Depending on the applications, the system 500 may include other components, including but not limited to non-volatile memory, chipsets, mass storage (such as hard disk, compact disk (CD), digital versatile disk (DVD), graphical or mathematic co-processors, and so forth.

In various embodiments, the system 500 may be a personal digital assistant (PDA), a wireless mobile phone, a tablet computing device, a laptop computing device, a desktop computing device, a set-top box, an entertainment control unit, a digital camera, a digital video recorder, a CD player, a DVD player, a network server, or device of the like.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the embodiments of the present invention. Therefore, it is manifestly intended that this invention be limited only by the claims.

What is claimed is:

1. An apparatus, comprising:
   a die coupled to a substrate;
   an underfill formed between the substrate and the die; and
   a marking formed on the underfill.

2. The apparatus of claim 1, wherein the marking is formed on an exposed portion of the underfill that extends outside of the die.

3. The apparatus of claim 2, wherein the exposed portion is an underfill tongue area, the underfill tongue area being used to dispense underfill material.

4. The apparatus of claim 2, wherein the exposed portion is bordered at least partly by an underfill barrier.

5. The apparatus of claim 4, wherein the underfill barrier is a selected one of a dam, a trench and an ink border.

6. The apparatus of claim 1, wherein the marking is selected from one of a laser marking, an ink marking and a decal marking.

7. The apparatus of claim 1, wherein the marking comprises a selected one of identification information and component information.

8. The apparatus of claim 1, wherein the die is a flip-chip.

9. The apparatus of claim 1, wherein the substrate is a BGA package.

10. The apparatus of claim 1, wherein the substrate is coupled to a circuit board.

11. A method, comprising:
    coupling a die to a substrate;
    forming an underfill between the substrate and the die; and
    forming a marking on the underfill.

12. The method of claim 11, wherein forming a marking on the underfill further comprises of forming the marking on an exposed portion of the underfill that is outside of the die.

13. The method of claim 11, wherein forming an underfill further comprises forming an underfill barrier on surface of the substrate and dispensing underfill material between the barrier and the die.

14. The method of claim 13, wherein forming an underfill barrier further comprises of forming is a selected one of a dam, a trench and an ink border.

15. The method of claim 13, further comprises of curing the underfill material.

16. The method of claim 11, wherein forming the marking is by a selected one of a laser marking, an ink marking and a decal marking.

17. The method of claim 11, wherein forming a marking is to provide a selected one of identification information and component information.

18. The method of claim 12, wherein the exposed portion is an underfill tongue area, the tongue area used to dispense underfill material.

19. The method of claim 12, further comprises of increasing the exposed portion by forming an underfill barrier.

20. A system, comprising:
    a die coupled to a substrate;
    an underfill formed between the substrate and the die;
    a marking formed on the underfill;
    a bus coupled to the substrate; and
    a networking interface coupled to the bus.

21. The system of claim 20, wherein the marking is formed on an exposed portion of the underfill that is outside of the die.

22. The system of claim 21, wherein the exposed portion is an underfill tongue area, the tongue area used to dispense underfill material.

23. The system of claim 21, wherein the exposed portion is bordered at least partly by an underfill barrier.

24. The system of claim 23, wherein the underfill barrier is a selected one of a dam, a trench and an ink border.

25. The system of claim 20, wherein the marking is selected from one of a laser marking, a ink marking and a decal marking.

26. The system of claim 20, wherein the system is a selected one of a set-top box, a digital camera, a digital video recorder, a CD player, and a DVD player.

* * * * *

UNITED STATES PATENT AND TRADEMARK OFFICE
CERTIFICATE OF CORRECTION

PATENT NO. : 7,015,592 B2  Page 1 of 1
APPLICATION NO. : 10/804801
DATED : March 21, 2006
INVENTOR(S) : Starkston et al.

It is certified that error appears in the above-identified patent and that said Letters Patent is hereby corrected as shown below:

Column 4
Line 33, "...of the underfill 106..." should read --of the underfill 106 at 104...--.

Signed and Sealed this

First Day of May, 2007

JON W. DUDAS
*Director of the United States Patent and Trademark Office*